(12) United States Patent
Seto et al.

(10) Patent No.: US 6,276,379 B1
(45) Date of Patent: Aug. 21, 2001

(54) ANTI-MICROBUBBLE DEPOSITION APPARATUS

(75) Inventors: Hideaki Seto; Haruhiko Yamamoto; Nobuyoshi Sato; Kyoko Saito, all of Tsukuba (JP)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/321,658

(22) Filed: May 28, 1999

(30) Foreign Application Priority Data

May 29, 1998 (JP) .................................. 10-150095

(51) Int. Cl.[7] ...................................................... B08B 3/04
(52) U.S. Cl. ........................................... 134/182; 134/902
(58) Field of Search ...................... 134/902, 182

(56) References Cited

U.S. PATENT DOCUMENTS 5,482,068 * 1/1996 Kitahara et al. ....................... 134/182
5,503,171 * 4/1996 Yokomizo et al. ................... 134/182

FOREIGN PATENT DOCUMENTS

136116 * 6/1993 (JP) ...................................... 134/902

* cited by examiner

Primary Examiner—Philip R. Coe
(74) Attorney, Agent, or Firm—Beyer Weaver & Thomas

(57) ABSTRACT

The present invention prevents deposition on product wafers of microbubbles generated from chemical solution circulation systems for wet etching or wet cleaning, or pure water supply systems during manufacturing processes of semiconductors or liquid crystals.

A separator is provided on the inner wall of a chemical solution bath for etching or cleaning wafers to cover a process solution nozzle. The separator comprises an upper microbubble discharge tube extending upright for discharging microbubbles and lower outlets for horizontally introducing a process solution into the process bath.

20 Claims, 5 Drawing Sheets

ANTI-MICROBUBBLE DEPOSITION APPARATUS

CLAIM OF FOREIGN PRIORITY UNDER 35 U.S.C. § 119

This patent application claims priority under 35 U.S.C. section 119 to Japanese Patent Application No. 150095/98, filed on May 29, 1998 which is incorporated herein by reference in its entirety.

FIELD OF THE INVENTION

The present invention relates to an apparatus which can greatly reduce deposition of microbubbles, generated from either chemical solution circulation systems for wet etching, wet cleaning, etc., or pure water supply systems, on product wafers during semiconductor, liquid crystals, etc. manufacturing processes.

BACKGROUND OF THE INVENTION

FIG. 1 is a flow diagram of a chemical solution circulation system used for conventional wet etching. Chemical solutions are drawn by a circulation pump 5 from an outer bath 3 of a chemical solution bath 1 and recycled to the chemical solution bath 1 through the circulation pump 5 and a filter 7. Then, these chemical solutions reach a product wafer 4 placed in a cassette 6 from a nozzle 8 of an inner bath 2 in the chemical solution bath 1 to etch or wash the wafer as shown in FIG. 2. Similarly, pure water is introduced into a water bath in a processing system from a pure water nozzle of the bath via a pure water line from a pure water preparing apparatus. Pure water is used to remove deposited particles or rinse chemical solutions from the product wafer. The product wafer etched or cleaned in these baths is dried by a spin drier or an IPA dryer to complete this process.

However, the chemical solutions provided to the bath may contain microbubbles generated by either the pump or variation in the pipeline diameter through which they have been circulated or other factors. Bubble-forming solutions decompose by themselves to generate microbubbles. Most microbubbles in the chemical solutions are recycled to the outer bath 3 of the chemical solution bath 1 via a deaeration line 9 provided in the housing of the filter 7 in FIG. 1.

However, some small microbubbles pass through the filter 7 and are circulated to the inner bath 2 together with chemical solutions from the nozzle 8 of the chemical solution bath 1, as shown in FIG. 2. The microbubbles 10 may be deposited on the product wafer 4. The regions of the product wafer 4 covered with microbubbles 10 are not etched or cleaned because the microbubble liquid membranes are impermeable to etching solutions or cleaning solutions. Moreover, those regions covered with microbubbles 10 are more likely to be contaminated with particles, because microbubbles attract particles floating in the chemical solution bath 1 to the microbubble liquid membranes. Bubble-forming solutions or surfactant-added chemical solutions particularly generate a larger amount of microbubbles.

Microbubbles are also generated in water washing baths due to the variation in the diameter of the pure water pipeline, the presence of a pure water flowmeter, etc. and are subsequently deposited on product wafers. Consequently, the chemical solutions may be insufficiently rinsed from the wafer surface and the product wafers may also be contaminated with particles.

However, no method currently exists to prevent microbubbles that pass through filters from being deposited on product wafers.

SUMMARY OF THE INVENTION

Microbubble deposition on product wafers can be prevented by providing means for orthogonally separating a chemical solution and microbubbles at the chemical solution nozzle of an inner bath of a chemical solution bath.

Accordingly, the anti-microbubble deposition apparatus of the present is provided on the inner wall of a etching or cleaning process bath to cover a process solution nozzle. The anti-microbubble deposition apparatus comprises an upper upright microbubble discharge tube and lower outlets for horizontally introducing a process solution into the process bath. A baffle may also be provided near the inlet of the microbubble discharge tube.

DETAILED DESCRIPTION OF THE PREFERRED EMBODIMENTS

Reference will now be made in detail to a preferred embodiment of the invention. An example of the preferred embodiment is illustrated in the accompanying drawings. While the invention will be described in conjunction with a preferred embodiment, it will be understood that it is not intended to limit the invention to one preferred embodiment. To the contrary, it is intended to cover alternatives, modifications, and equivalents as may be included within the spirit and scope of the invention as defined by the appended claims.

Figure 3:
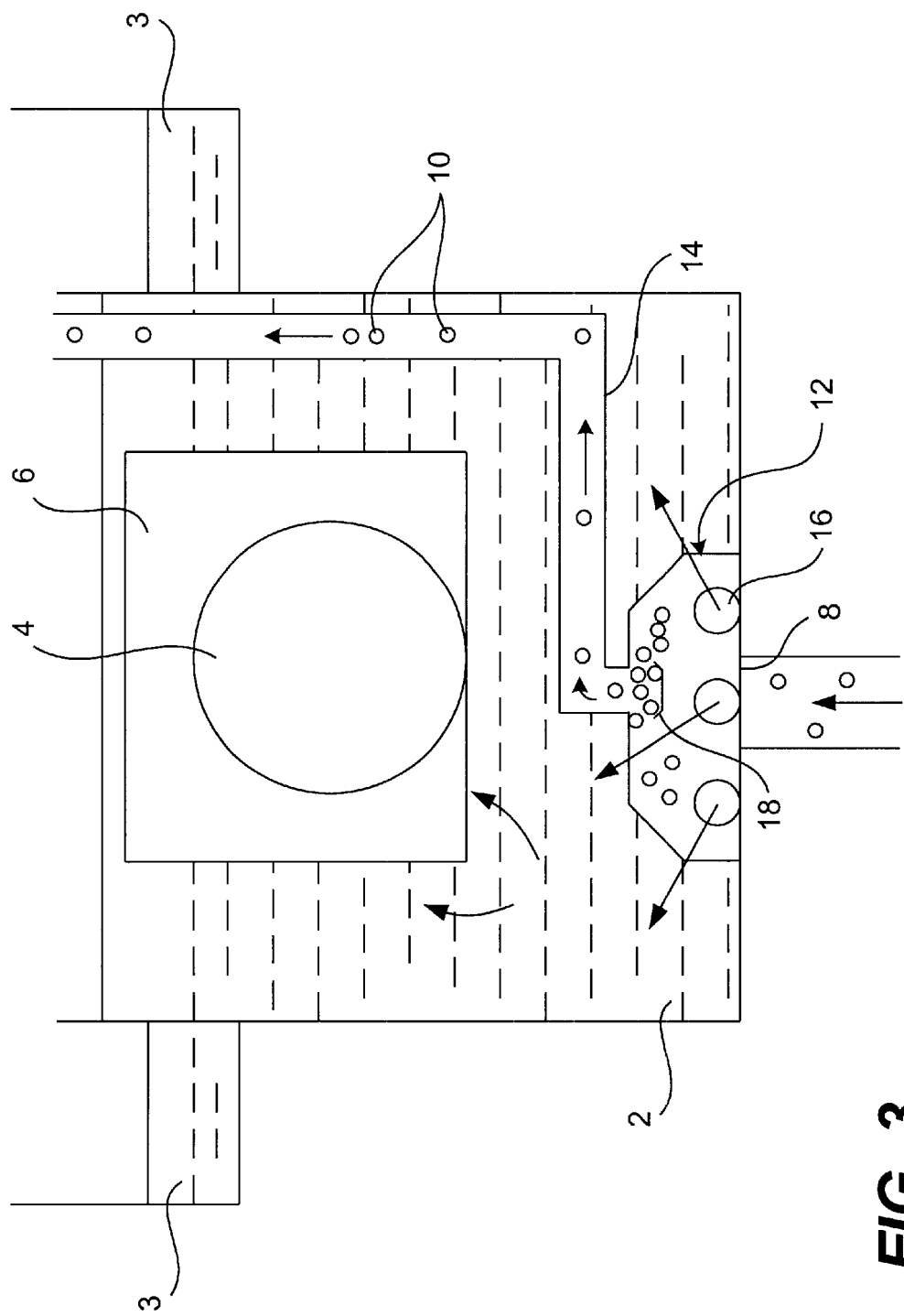
FIG. 3 and FIG. 3a are schematic views showing the process in which microbubbles deposition on a wafer is prevented by providing an anti-microbubble deposition apparatus in a chemical solution bath.

An example of the anti-microbubble deposition apparatus according to the present invention is shown in FIG. 3. In this example, a polygonal anti-microbubble deposition apparatus 12 having a definite volume is formed on the inner wall of an inner bath 2 of a chemical solution bath 1 to cover nozzle 8. At the top of the anti-deposition apparatus 12 is provided a microbubble discharge tube 14 extending upright above the liquid level of the chemical solution to directly release microbubbles into the atmosphere.

Figure 3A:
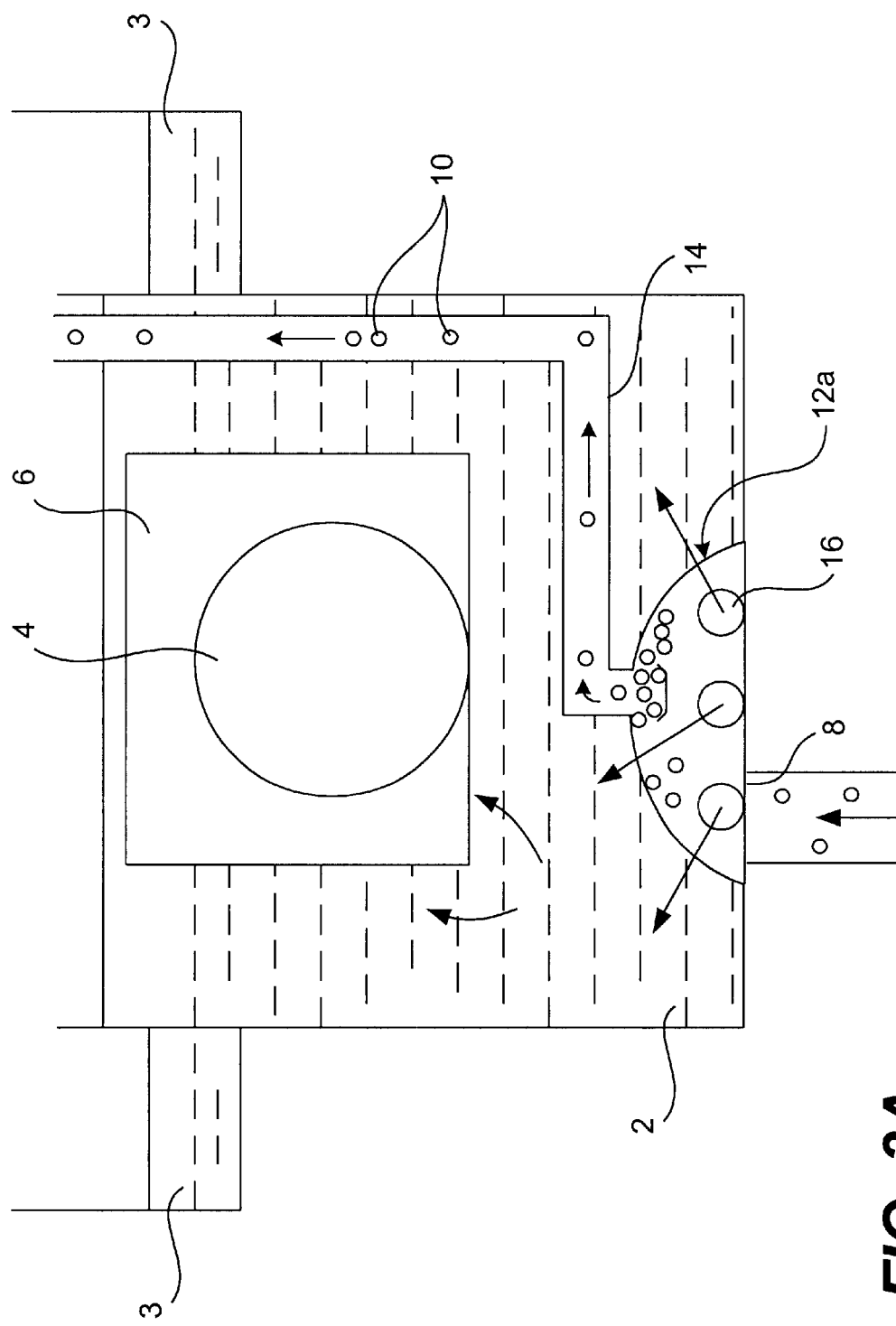

At the lower portion of the anti-deposition apparatus 12 are formed a plurality of circular chemical solution outlets 16 on the side face of the anti-deposition apparatus 12 so that the chemical solution horizontally flows out from the chemical solution outlets 16 into the inner bath 2. A baffle 18 is provided near the inlet of the microbubble discharge tube 14 at the top of the anti-deposition apparatus 12 to ensure that the chemical solution flown in from the chemical solution nozzle 8 can not directly run to the discharge tube 14. When the baffle 18 is not provided, the chemical solution nozzle 8 and the inlet of the microbubble discharge tube 14 are preferably arranged out of alignment as shown in FIG. 3a.

The anti-deposition apparatus 12 may be in any shape that helps microbubbles to join together to rise up, but is not specifically limited to the shape as shown in FIG. 3. A semispherical shape is also preferable. A semi-spherical shaped anti-deposition apparatus 12a is shown in FIG. 3a.

The size of the anti-deposition apparatus 12 depends on the flow rate of the chemical solution, the size of the chemical solution bath, etc. Preferably the anti-deposition apparatus has a volume of between about 10 to about 100% of the amount of the chemical solution circulated or supplied per minute. The inner diameter of the microbubble discharge tube 14 is preferably between about 1 mm to about 100 mm. The anti-deposition apparatus 12 having the baffle 18 maybe made from quartz, Teflon, polypropylene, polyethylene, vinyl chloride, SUS, or any other suitable material. Preferably, the size of the chemical solution outlets 16 is determined in such a manner that the total area of the chemical solution outlets is within the range from 0.5 to 10 times the sectional area of the pipeline for chemical solutions or pure water.

Figure 1:
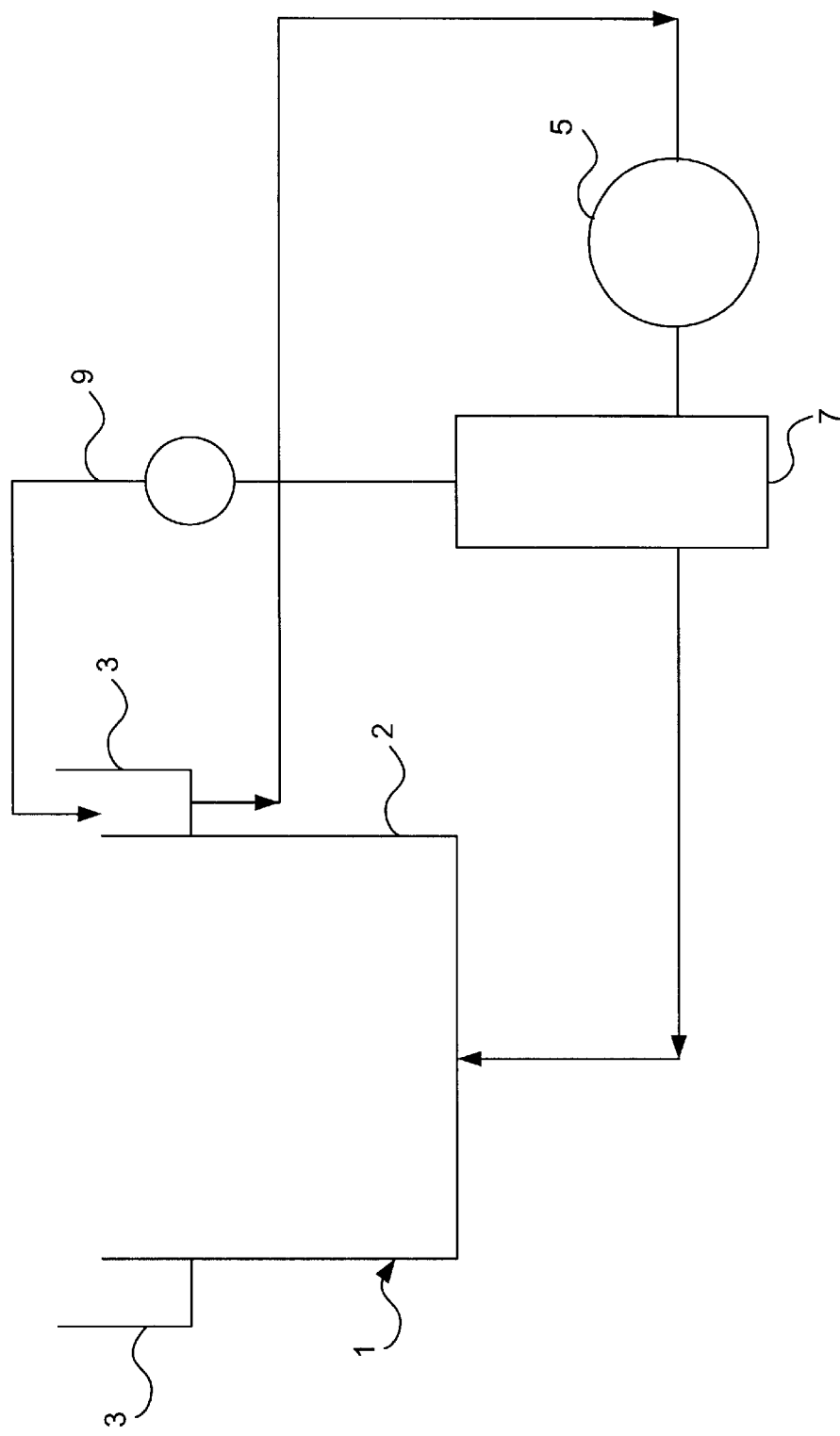
FIG. 1 is a flow diagram of a chemical solution circulation system used for conventional wet etching.
Figure 2:
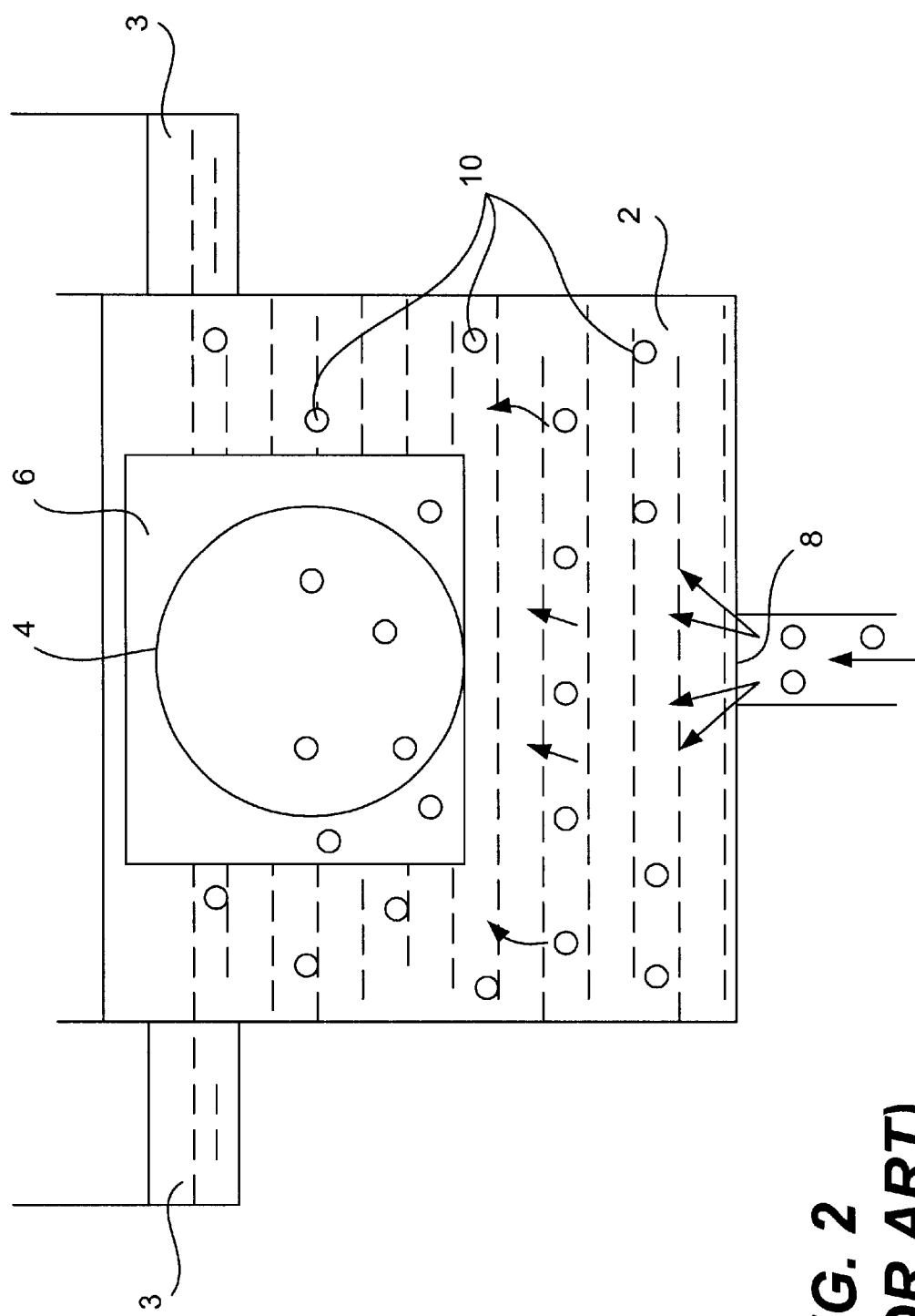
FIG. 2 is a schematic view showing the process in which microbubbles from chemical solutions are deposited on a wafer in a chemical solution bath.

Now, the flow of a chemical solution and the flow of microbubbles are explained with reference to FIGS. 1 and 3. In FIG. 1, a chemical solution containing microbubbles, generated by the pump 5 or the variation in the diameter of the pipeline through which it has been circulated, or microbubbles generated from a bubble-forming solution, is introduced from the nozzle 8 into the anti-microbubble deposition apparatus 12 in the inner bath 2 of the chemical solution bath 1, as shown in FIG. 3. Within the anti-deposition apparatus 12, microbubbles 10 in the chemical solution rise to the top of the anti-deposition apparatus 12 and are released from the bath to the outer air through the microbubble discharge tube 14 without coming into contact with the product wafer 4.

On the other hand, the chemical solution freed of microbubbles horizontally flows out from the outlets 16 into the bath to act on the product wafer 4 to etch or wash it in the inner bath 2. Here, the chemical solution circulated from the chemical solution nozzle 8 into the anti-deposition apparatus 12 is prevented from flowing directly into the microbubble discharge tube 14 by the presence of the baffle 18, whereby microbubbles 10 are not scattered by the chemical solution flow.

This anti-microbubble deposition apparatus can be suitably used in wet processes using $NH_4OH$, $H_2O_2$, HF, $HNO_3$, $H_3PO_4$, HCl, $H_2SO_4$, buffered hydrofluoric acid (HF:$NH_4F$= 1:5 to 1:500), IPA, stripping agents, organic solvents or these chemical solutions containing surfactants or the like. Specifically, this apparatus is especially effective for bubble-forming chemical solutions generating a large amount of microbubbles, such as: SC1 cleaning solution: $NH_4OH$:$H_2O_2$:$H_2O$=1:1:6 (65° C.) in which $H_2O_2$ may be replaced by $O_3$; $SC_2$ cleaning solution: HCl:$H_2O_2$:$H_2O$= 1:1:5 (80° C.) in which $H_2O_2$ may be replaced by $O_3$; sulfuric acid-hydrogen peroxide cleaning solution: $H_2SO_4$:$H_2O_2$=9:1 (120° C.) in which $H_2O_2$ may be replaced by $O_3$; hydrofluoric acid-hydrogen peroxide cleaning solution: HF (0.5%):$H_2O_2$ (10%) (room temperature); and HF or buffered hydrofluoric acid containing a surfactant.

When this anti-microbubble deposition apparatus is used to clean wafers with water in a water-washing bath, it can also prevent deposition of particles on the wafers in the exactly same manner as described above. In this case, suitable water-washing baths include overflow baths, quick dump rinse baths, shower quick dump rinse baths, etc.

EXAMPLE

The following example describes specific aspects of the invention to illustrate the invention to aid those of skill in the art in understanding and practicing the invention. The example should not be construed as limiting the invention in any manner.

The following comparative experiments were performed either in the presence or absence of the microbubble deposition apparatus of the present invention in the bath. FIGS. 4(a) and (b) show a schematic views of the apparatus used in these experiments. In FIG. 4(a), an anti-microbubble deposition apparatus 12 similar to the apparatus shown in FIG. 3 was provided in an inner bath 2, in which was immersed a funnel 20 having an opening diameter of 18 cm above the apparatus and closed at one end with a tape.

In these experiments, a surfactant-added buffered hydrofluoric acid ($NH_4F$:HF=100:1) was used. A pump was actuated in the chemical solution circulation system shown in FIG. 1 to circulate the buffered hydrofluoric acid. After a 60-minute run in this state, the air collected at the closed end of the funnel 20 was transferred to a graduated cylinder for measurement. Other experiments involved a circulation flow rate of the buffered hydrofluoric acid at 20 L/min, a bath volume of 30 L, and a filter diameter of 0.1 Mm. 17 cc of air was collected using the anti-microbubble deposition apparatus.

Figure 4B:
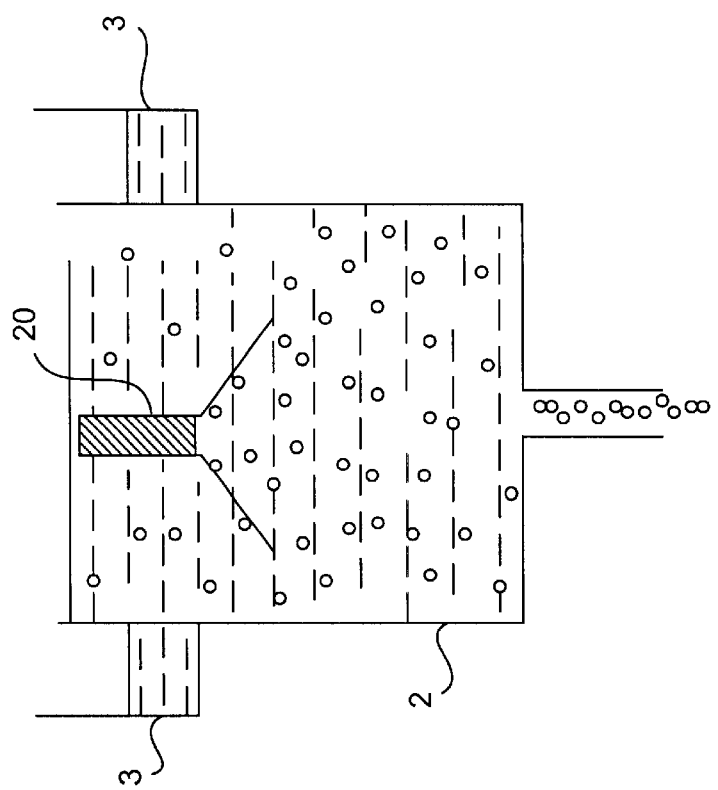
FIG. 4b is a schematic view of a process bath without an anti-microbubble deposition apparatus of the present invention.
Figure 4A:
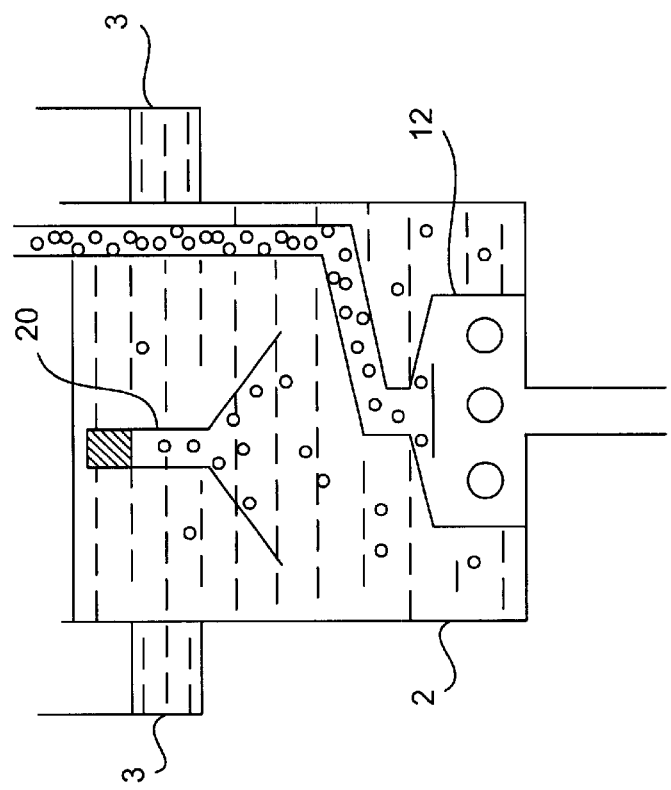
FIG. 4a is a schematic view of a process bath with an anti-microbubble deposition apparatus of the present invention.

The same experiments were performed using the apparatus depicted in FIG. 4(b). Here, a funnel 20 having an opening diameter of 18 cm above the apparatus and closed at one end with a tape was provided in inner bath 2. 73 cc of air was collected without using the anti-microbubble deposition apparatus.

These results revealed that microbubbles can be greatly decreased as compared with previous systems by using this anti-microbubble deposition apparatus. The anti-microbubble deposition apparatus of the present invention can effectively separate microbubbles from process solutions to greatly reduce deposition of microbubbles on product wafers, by orthogonally providing a route for discharging microbubbles and a route for introducing process solutions freed of microbubbles into the process bath. The reduction in microbubble deposition prevents etching and cleaning failures on product wafers and thus improve yields. Moreover, separation of microbubbles from chemical solutions can extend the life of the chemical solutions to reduce their costs.

Although the foregoing invention has been described in some detail to facilitate understanding, it will be apparent that certain changes and modifications may be practiced within the scope of the appended claims. Furthermore, it should be noted that there are alternative ways of implementing both the process and apparatus of the present invention. For example, the use of an anti-microbubble deposition apparatus is not restricted to process solutions for product wafers but may be used wherever microbubble deposition is a problem. Similarly the anti-microbubble deposition apparatus may be used with any solution where microbubble deposition is a problem. Accordingly, the present embodiments are to be considered as illustrative and not restrictive, and the invention is not to be limited to the details given herein, but may be modified within the scope and equivalents of the appended claims.

What is claimed is:

1. An anti-microbubble deposition apparatus, provided on the inner wall of a wafer process bath, and covering a process solution nozzle, comprising:

an opening in the upper portion of the apparatus for connecting to an inlet of an upper microbubble discharge tube extending upright for discharging microbubbles; and lower outlets for horizontally introducing a process solution into the process bath.

2. A semiconductor wafer processing system comprising:

a process solution; and an anti-microbubble deposition apparatus, provided on the inner wall of a wafer process bath and covering a process solution nozzle, comprising:

an opening in the upper portion of the apparatus for connecting to an inlet of an upper microbubble discharge tube extending upright for discharging microbubbles; and lower outlets for horizontally introducing the process solution into the process bath.

3. A semiconductor wafer processing system according to claim 2, wherein the process solution is a cleaning solution.

4. An anti-microbubble deposition apparatus according to claim 1, wherein the process solution nozzle and the inlet of the microbubble discharge tube are not aligned.

5. An anti-microbubble deposition apparatus according to claim 1, wherein the anti-microbubble deposition apparatus forms a semi-spherical enclosure.

6. An anti-microbubble deposition apparatus according to claim 1, wherein a baffle is provided near the inlet of said microbubble discharge tube.

7. An anti-microbubble deposition apparatus according to claim 1, wherein the anti-microbubble deposition apparatus is comprised of a material selected from the group consisting of quartz, Teflon, polypropylene, polyethylene, vinyl chloride and SUS.

8. An anti-microbubble deposition apparatus according to claim 1, wherein the anti-microbubble deposition apparatus has a volume of between about 10% to about 100% of the volume of the process solution that circulates through the process solution nozzle per minute.

9. An anti-microbubble deposition apparatus according to claim 1, wherein the microbubble discharge tube has a inner diameter between about 1 mm to about 100 mm.

10. A semiconductor wafer processing system according to claim 2, wherein the process solution is comprised of chemical compounds selected from the group consisting of $NH_4OH$, $H_2O_2$, $HF$, $HNO_3$, $H_3PO_4$, $HCl$, $H_2SO_4$, buffered hydrofluoric acid ($HF:NH_4F=1:5$ to $1:500$), IPA, stripping agents, organic solvents, surfactants, water and mixtures thereof.

11. A semiconductor wafer processing system according to claim 2, wherein the process solution is $NH_4OH:H_2O_2:H_2O=1:1:6$ at 65° C.

12. A semiconductor wafer processing system according to claim 11, wherein the $H_2O_2$ is replaced by $O_3$.

13. A semiconductor wafer processing system according to claim 2, wherein the process solution is $HCl:H_2O_2:H_2O=1:1:5$ at 80° C.

14. A semiconductor wafer processing system according to claim 13, wherein the $H_2O_2$ is replaced by $O_3$.

15. A semiconductor wafer processing system according to claim 14, wherein the $H_2O_2$ is replaced by $O_3$.

16. A semiconductor wafer processing system according to claim 2, wherein the process solution is $H_2SO_4:H_2O_2=9:1$ at 120° C.

17. A semiconductor wafer processing system according to claim 2, wherein the process solution is HF (0.5%):$H_2O_2$ (10%) at 25° C.

18. A semiconductor wafer processing system according to claim 2, wherein the process solution is HF or buffered hydrofluoric acid containing a surfactant.

19. An anti-microbubble deposition apparatus according to claim 1, wherein the total area of the lower outlets is between about 50% to about 1000% the sectional area of a pipeline for process solution flow.

20. A semiconductor wafer processing system according to claim 2, wherein the process solution is an etching solution.

* * * * *